Feb. 4, 1969 W. HEYWANG 3,426,255

FIELD EFFECT TRANSISTOR WITH A FERROELECTRIC CONTROL GATE LAYER

Filed June 29, 1966

United States Patent Office 3,426,255
Patented Feb. 4, 1969

3,426,255

FIELD EFFECT TRANSISTOR WITH A FERRO-ELECTRIC CONTROL GATE LAYER

Walter Heywang, Munich, Germany, assignor to Siemens Aktiengesellschaft, Munich and Berlin, Germany, a German corporation Filed June 29, 1966, Ser. No. 561,650
Claims priority, application Germany, July 1, 1965, S 97,929
U.S. Cl. 317—235 23 Claims
Int. Cl. H01l 11/14

ABSTRACT OF THE DISCLOSURE

A single crystal semiconductor has a source and drain with an interconnecting channel between them. A crystal ferroelectric layer crystallographically connects with the channel so that both crystal bodies form a single crystal structure. Electrode means are connected to the source, drain and gate.

My invention relates to controllable electronic semiconductor devices whose crystalline semiconductor body has a current path extending between electrodes and passing through a surface zone which, for controlling the current flow through the path, is contacted by a layer of ferroelectric material carrying a control electrode.

It is an object of my invention to improve such devices by decreasing the losses and thereby permitting a decrease in control or signal voltage, as will be explained presently with reference to the accompanying drawing in which.

Figure 1:
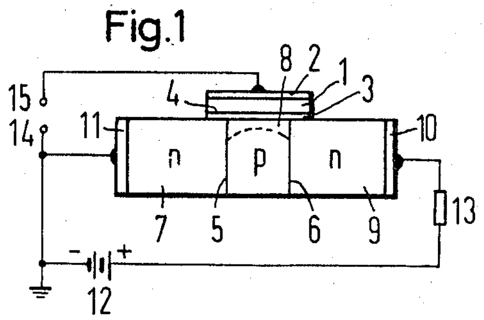
FIG. 1 is explanatory and shows schematically a semiconductor device of the above-mentioned type.

A semiconductor device of the type with which my invention concerns itself, is exemplified in FIG. 1. The illustrated device comprises a semiconductor crystal with an n-p-n sequence of regions 7, 8, 9 of alternately opposed types of conductivity. Each two of these regions form a p-n junction 5 or 6. The two outer regions 7, 9 are provided with respective electrodes 10 and 11. These are shown connected with each other through a voltage source 12 and a load resistor 13. Deposited upon a surface area 4 of the semiconductor crystal is a ferroelectric layer 1 which carries an electrode 2. A signal voltage for controlling the semiconductor device is applied between the terminals 14 and 15.

Figure 2:
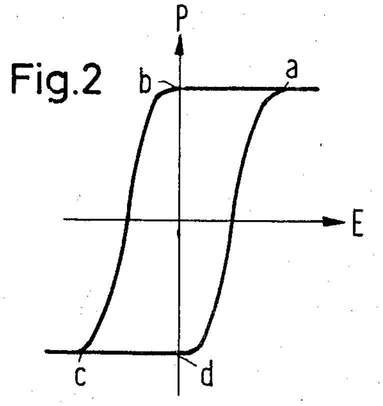
FIG. 2 is an explanatory graph relating to devices of the same type.

Ferroelectrical substances exhibit electrostatic hysteresis. Thus, in FIG. 2, the polarization field P in a ferroelectrical element is plotted over an applied electrostatic field E. The resulting curve permits determining the magnitude and polarity of the electrical charge induced at the surface of the ferroelectric when the ferroelectric crystal is acted upon by an electrostatic field extending parallel to the electrostatic axis of the ferroelectric crystal.

Consequently, in a device as exemplified in FIG. 1, the conductivity of a "channel," namely a current path indicated by dashed lines in the middle region 8, can be varied by changing the polarization of the ferroelectric layer 1 and consequently by applying a correspondingly poled signal voltage between the terminals 14 and 15, thus correspondingly affecting the surface charge of the semiconductor body immediately adjacent to the ferroelectric layer. For example, when the signal voltage between the terminals 14 and 15 produces a positive charge in the middle region 8 immediately adjacent to the ferroelectric layer, the negative charge carriers are pulled toward the surface of the semiconductor crystal and compensate the holes in the zone of region 8, closely beneath the surface 4. If, under these conditions, the surface charge is sufficiently large, the electrons will preponderate in the current path 38 so that an n-type "channel" is formed which electrically interconnects the regions 7 and 9, thus permitting a flow of current from region 7 to region 9. It is frequently unfavorable that at zero polarization voltage there may obtain surface charges at the boundary face between semiconductor and ferroelectric, which already suffice to cause crowding of charge carriers, thus producing a "channel." Since ferroelectrics exhibit electrostatic hysteresis as typified by FIG. 2, a portion of the electrostatic charge will be stored. That is, the conductivity state of the "channel" in the semiconductor crystal remains preserved, even after an electrostatic field transverse to the ferroeletcric, and hence perpendicular to the semiconductor surface 4, is no longer effective. For example, if the direction of the polarization previously correspond to point *a* on the hysteresis loop of FIG. 2, there remains a permanent polarization as indicated by point *b*, after an external field is no longer active. For switching the semiconductor device back to the state of high resistance at which only the normal blocking (inverse) current of the p-n junction 5 and 6 can pass through, a signal is applied to the terminals 14 and 15 that produces an electrostatic field transverse to the ferroelectric and sufficient to invert the polarizing direction down to point *c* in FIG. 2, thus inducing in the semiconductor crystal a surface charge of the reversed polarity. This state, too, remains stored in accordance with the remanent polarization corresponding to point *e*.

The semiconductor device illustrated in FIG. 1 can therefore be switched from high conductivity or forward conductance, to low conductivity or the blocked state, and vice versa, each time by applying an electrostatic field whose direction is reversed relative to the one previously effective and whose strength suffices to overcome the remanent polarization. For best possible utilization of the electrostatic field transverse to the ferroelectric, this field should be as close as possible to the semiconductor surface. Heretofore, the main attempts at achieving proximity were based upon a treatment of the mutually adjacent surfaces of the ferroelectric and the semiconductor body. This, however, always leaves a gap between the ferroelectric and the semiconductor surface, such a gap being shown at 3 in FIG. 1, although exaggerated for the purpose of illustration. Any such gap results in partial loss of the surface charge and requires applying a stronger electrical field. To reduce the loss of the surface charge in the interspace, it has been further attempted to provide a dielectric material of a highest feasible dielectrical constant between the ferroelectric and the semiconductor surface. Such expedients are difficult and costly, mainly on account of the small size of the semiconductor devices. Furthermore, none of the above-mentioned expedients succeeds in eliminating the loss of surface charge.

It is a more specific object of my invention, relating to semiconductor devices generally of the type described above, to eliminate the shortcomings of this type devices as heretofore known, and to provide a ferroelectrically controlled semiconductor device which is not affected by losses in surface charge and hence permits operating with a lower electrostatic field strength and consequently a lower signal voltage under otherwise comparable conditions.

According to my invention, the semiconductor crystal of the device and its ferroelectric layer for the voltage-responsive control of the semiconductor device are integrated so as to form a single crystalline body. That is, the crystal lattice of the semiconductor body and that of the ferroelectric are coalesced so that the lattice of one crystal directly merges with that of the other. This affords maximal utilization of the electrostatic field applied transversely of the ferroelectric and serving to control the conductivity of the semiconductor portion of the integral crystal. As a result, the field strengths required for controlling the device are considerably lower than in an otherwise comparable device of the known type. Additional surface charges at the boundary face semiconductor-ferroelectric are also avoided.

I have found it particularly favorable to employ ferroelectric substances which exhibit the Perowskit structure as is the case with barium titanate, for example.

In devices according to the invention, the semi-conductor crystal and/or the integral layer of ferroelectric material may have monocrystalline constitution.

According to a preferred embodiment of the invention, the ferroelectric layer consists of monocrystalline barium titanate and the semiconductor body of polycrystalline cadmium sulphide or cadmium telluride. It has also been found favorable to employ monocrystalline silicon for the semiconductor body. Thus, according to another preferred embodiment of the invention, the semiconductor body proper is formed of monocrystalline silicon and the integral ferroelectric layer of polycrystalline barium titanate.

According to another feature of the invention, the substance forming the ferroelectric layer or the semiconductor body is given an addition of a slight quantity of a further semiconductor or ferroelectric substance for the purpose of adapting the lattice constants of the semiconductor and the ferroelectric to each other and to thereby afford producing the ferroelectric layer of epitaxial growth on the semiconductor crystal or, conversely, producing the semiconducting material by epitaxial growth on the ferroelectric layer. For permitting such an epitaxial growth, it is essential that the ratio of the respective lattice constants have substantially the value of an integral fraction.

Figure 3:
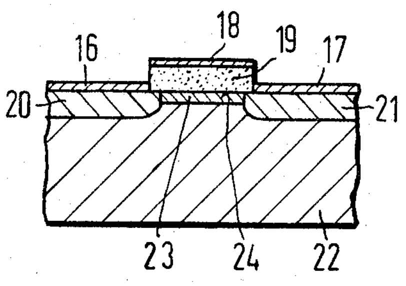
FIG. 3 is a schematic and sectional view of a semiconductor device according to the invention.

FIG. 3 shows by way of example an embodiment of a semiconductor device according to the invention. As regards external design, this device is comparable to a metal-oxide transistor of known type. Such a device, produced for example by the planar technique, has within its semiconductor crystal a surface zone that constitutes a current path or channel 23 bordered at both ends by respective semiconducting regions 20 and 21 of which each is contacted by an electrode 16 or 17. In a metal-oxide transistor, the current-path zone 23 is coated with a layer 19 of oxide, for example silicon dioxide which is likewise provided with an electrode 18. The semiconductor crystal 22 may have intrinsic conductivity (i-type) or it may have the same extrinsic conductivity type as the current path 23. In accordance with the terminology applying to unipolar transistors, the zone 20 acting as the emitter is called "source" and the zone 21 acting as collector is called "sink." The electrode 18 constitutes the gate or grid electrode of the device. In a metal-oxide transistor the conductivity of a portion of current path 23 is controlled in dependence upon the voltage impressed between the electrodes 16 and 18 or between the electrodes 16 and 17. Depending upon the polarity of the voltage, the charge carriers are driven to the surface area covered by the oxide coating or they are pulled away from this area. For example, when the current path 23 possesses the same conductivity as the adjacent semiconducting regions 20 and 21, for example n-type conductivity, then the application of a bias voltage to the gate electrode in the blocking direction will make it possible to pull the majority charge carriers, in this case the electrons, away from the semiconductor surface, so that a sufficiently high negative bias will cause the formation of a p-conducting layer which prevents the flow of current between the n-type regions 20 and 21. When applying a bias voltage in the forward direction, however, the charge carriers are driven to the coated surface area so that the current will increase with increasing gate voltage.

If the entire portion of the semiconductor body between the regions 20 and 21 has the opposed type of conductance, for example p-conductivity, then only the blocking current of the p-n junctions will initially flow. When a positive bias voltage is applied to the gate electrode, the holes are drawn away from the portion of the p-type zone adjacent to the ferroelectric 19; and as the gate voltage increases the electrons in a "channel" closely beneath the surface of the semiconductor body become crowded to such an extent that an n-type current path 23 comes about within the p-type zone 22 closely beneath the surface. The n-type inversion layer thus produced results in a flow of charge carriers from region 16 to region 17.

Now according to the invention, the layer 19 in a device as shown in FIG. 3 is formed of ferroelectric material and constitutes a single crystalline body together with the semiconductor crystalline material underneath. In this manner, the metal-oxide transistor can be converted to a bi-stable device suitable as a current switch. When employing barium titanate for the ferroelectric layer 19, a polarity reversal of the layer and the resulting polarity change of the surface charge of the ferroelectric causes a charge-carrier change of about $10^{-5}$. In a device according to the invention in which the semiconductor crystal and the ferroelectric layer form a single integral crystal, this change in charge is furnished exclusively by charge carriers which are driven toward or away from the surface. This causes a change in charge-carrier density of $10^{14}/cm.^2$ within the "channel."

As explained above with reference to FIG. 1, the reverse poling of the ferroelectric and hence the switching from open to closed state or vice versa, requires applying an electrostatic field perpendicular to the semiconductor surface and consequently transverse to the ferroelectric layer, at a field strength sufficient to overcome the remanent polarization of the ferroelectric. That is, the required field strength is larger than the coercitive field strength.

To reliably secure a control of the electrical conductivity, in at least a portion of the current path beneath the semiconductor surface adjacent to the ferroelectric, and in dependence upon the surface charge generated in the ferroelectric, the coercitive field strength required for the control must be smaller than the "pinch-off voltage" which the semiconductor device would have without the ferroelectric. The "pinch-off voltage" is defined as the voltage between gate and sink, and hence between the electrodes 18 and 17, at which the concentration of the movable charge carriers in the "channel" is just equal to zero. Since the magnitude of the coercitive field strength required for overcoming the remanent polarization depends upon the thickness of the ferroelectric, it is advisable to keep the thickness of the ferroelectric layer smaller than 1 mm., preferably smaller than 0.1 mm.

The electrostatic field needed for the contmrol of the device may be produced, for example, by maintaining the gate voltage constant in the open state of the device and increasing the voltage between source and sink. Then the current flowing between source and sink will first increase continuously, until the voltage between gate and sink exceeds the coercitive field strength of the ferroelectric. This overcomes the remanent polarization of the ferroelectric, so that the ferroelectric reverses its polarity, and the polarity of the surface charge also changes. As a result, the semiconductor device switches to the closed state and can thereafter be opened only by applying a counter voltage. However, the opening and closing of the device may also be effected with a constant voltage between source and sink, by applying corresponding voltage pulses to the gate.

If the semiconducting regions 20, 21 and the current path 23 have the same conductivity type, the product of the thickness of the current path perpendicular to the surface covered by the ferroelectric layer times the charge-carrier concentration in the curent path should be smaller than, or at most be equal to, $10^{13}/cm.^2$. As explained with reference to FIG. 3, if the current path 23 has the same type of conductivity as the adjacent semiconductor regions 20 and 21, the blocking of the current flow between source and sink is achieved when changing the conductivity type of the current path 23 by correspondingly changing the poling of the ferroelectric. With this type of control, complete blocking can be secured only if the current path 23 converts to the opposed conductivity type over its entire thickness. This is secured according to the invention by a corresponding choice of the current-path thickness and the dopant density in the current path.

For minimizing the coercitive field strength needed for the control, it is further advisable to form the ferroelectric layer of individual laminations.

Described in the following are preferred methods of producing a semiconductor device according to the invention. It is favorable to produce the semiconductor body and/or the ferroelectric layer by growing it from the gaseous or vaporous phase. According to one mode of this method according to the invention, I employ a semiconductor crystalline body as a substrate and grow upon it, by precipitation from a gas or vapor, a ferroelectric mixed crystal. The components forming the mix crystal are added to the gas or vapor in such a ratio that the segregating and precipitating ferroelectric mix crystal has the lattice constant needed for epitaxial growth. According to an embodiment of this method, a substrate of monocrystalline silicon is employed and a ferroelectric mix crystal consisting essentially of barium titanate is precipitated upon the silicon. The gas or vapor atmosphere used is given an addition of lead titanate or lead titanium stannate in such an amount that the lattice constant of the ferroelectric is related to that of silicon substantially in the ratio of 4:3. If, by admixture of such substances, the lattice constants of the ferroelectric layer and of the semiconductor substrate are adapted to each other in the ratio just given, the growing layer, consisting essentially of barium titanate, will form an epitaxial monocrystal integral with the monocrystal of the silicon substrate.

The precipitation of barium titanate or of a mixed crystal consisting essentially of barium titanate by vapor deposition onto a silicon monocrystal is preferably performed at a temperature of 1050° to 1100° C.

According to another mode of the method according to the invention, I employ as substrate a layer of ferroelectric material and precipitate thereupon the semiconductor material, for example a semiconducting mix crystal. The components forming the mix crystal are added to the gaseous or vaporous atmosphere in such a ratio that the precipitating mix crystal has a lattice constant as required for epitaxial growth.

According to a preferred embodiment of this type, the substrate consists of barium titanate, and the semiconductor portion of the integral crystal is formed of a mix crystal consituted of $A^{III}B^{V}$ semiconductor compounds. For this purpose, gallium arsenide and gallium antimonide have been found particularly favorable mix-crystal components. The share of the mix-crystal components is preferably so chosen that the lattice constant of the barium titanate to that of the semiconductor material is substantially equal to 2:3. This ensures an epitaxial monocrystalline growth of the semiconductor upon the ferroelectric.

It is particularly favorable to employ a ferroelectric electric mix crystal as substrate and to precipitate the semiconductor layer thereupon. For adaptation of the lattice constants to obtain monocrystalline growth, the mix crystal for the substrate is preferably chosen accordingly. Suitable as a substrate for monocrystalline precipitation of silicon, for example, is a mix crystal of the titanates of barium, lead and tin.

For epitaxial growth of silicon upon a layer of ferroelectric material, it is especially favorable to vapor-deposit the silicon in a high vacuum upon a substrate consisting particularly of barium titanate with an admixture of lead titanate and/or lead titanium stannate. A high vacuum of $10^{-9}$ torr reliably provides for a clean surface and a monatomic covering of the substrate.

According to another feature of my invention, the layer of ferroelectric material, prior to providing it with a body of semiconductor material, is grown upon a metal carrier, particularly a carrier which subsequently may serve as an electrical terminal for the ferroelectric layer. Tantalum or molybdenum have been found particularly well suitable for use as much a support.

Figure 4:
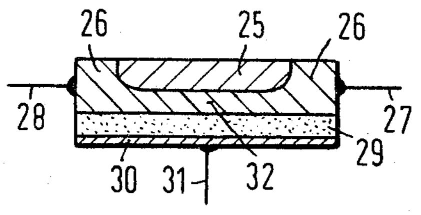
FIG. 4 is a schematic and sectional view of another device corresponding to the invention.

The embodiment illustrated in FIG. 4 is made in the manner just mentioned. An electrode 30 of tantalum is joined with a terminal wire 31. Deposited upon the tantalum electrode 30 is a layer of ferroelectric material 29, for example barium titanate, preferably produced by vapor deposition. Silicon is deposited upon the ferroelectric layer 29, for example by vapor deposition in high vacuum. Thereafter a dopant metal is diffused into the silicon, preferably by the conventional planar technique. This produces in the silicon crystal 32 of one type of conductivity a region 25 of the opposed conductivity type. In this embodiment, the regions 26 adjacent to the respective ends of the current path 32 thus formed have the same conductivity type as the current path. These outer regions 26 are provided with respective terminals 27 and 28 whose corresponding electrodes on the semiconductor crystal constitute the above-mentioned "source" and "sink" respectively, the electrode 30 being the gate. If the current path 32 has n-type conductivity, a corresponding poling of the ferroelectric 29 to produce a negative surface charge of the semiconductor body at the side facing the ferroelectric, causes the electrons to be driven away from the current path 32, thus converting the current path to p-type conductivity. This interrupts the current flow between the two regions 26 and hence between the terminals 27 and 28.

To those skilled in the art, it will be obvious from a study of this disclosure that my invention is amenable to a great variety of modifications and hence may be given embodiments other than particularly illustrated and described herein, without departing from the essential features of my invention and within the scope of the claims annexed hereto.

I claim:

1. In a semiconductor device comprising a semiconductor crystalline body having two regions of the same conductivity type spaced from each other and having a channel zone extending beneath a surface area of said body and between said two regions to provide a current path therebetween, and a ferroelectric layer situated on said surface area and having a contact for applying a voltage to control the conductivity of said current path, the improvement according to which said semiconductor crystalline body and said ferroelectric layer form respective portions of a single integral crystal.

2. In a semiconductor device according to claim 1, said ferroelectric portion of said integral crystal having Perowskit structure.

3. In a semiconductor device according to claim 1, said ferroelectric portion of said integral crystal consisting substantially of barium titanate.

4. In a semiconductor device according to claim 1, said semiconductor portion having monocrystalline constitution.

5. In a semiconductor device according to claim 1, said portion of ferroelectric material having monocrystalline constitution.

6. In a semiconductor device according to claim 1, said ferroelectric portion consisting of monocrystalline barium titanate, and said semiconductor portion of said integral crystal being formed of polycrystalline cadmium sulphide or cadmium telluride.

7. In a semiconductor device according to claim 1, said semiconductor portion of said integral crystal consisting of monocrystalline silicon and said ferroelectric portion consisting of polycrystalline barium titanate.

8. In a semiconductor device according to claim 1, the coercitive field strength of said ferroelectric portion for controlling said current path being smaller than the pinch-off voltage of the semiconductor device.

9. In a semiconductor device according to claim 8 said ferroelectric portion of said crystal having a thickness smaller than 1 mm.

10. In a semiconductor device according to claim 8, said ferroelectric layer of said crystal having a thickness smaller than 0.1 mm.

11. In a semiconductor device according to claim 1, said semiconducting regions having a conductivity type opposed to that of said current path.

12. In a semiconductor device according to claim 1, said regions having the same conductivity type as said current path, and the product of the minimum thickness of said current path perpendicular to said surface area times the dopant concentration of the current path being at most equal to $10^{14}/cm.^2$.

13. The method of producing a semiconductor device comprising a semiconductor crystalline portion having two regions of the same conductivity type spaced from each other and having a channel zone extending beneath a surface area of said body and between said two regions to provide a current path therebetween, and a ferroelectric layer portion situated on said surface area and having a contact for applying a voltage to control the conductivity of said current path, said method comprising the steps of precipitating the material of one of said respective semiconductor and ferroelectric portions from the gaseous phase upon a substrate formed by the other one of said two portions thereby epitaxially coalescing both portions into a single integral crystal.

14. The method according to claim 13, wherein said semiconductor portion forms the substrate and the ferroelectric portion is precipitated upon the semiconductor portion as a mix crystal, the components of said mix crystal being added to the gasous phase in the ratio required for epitaxial growth of the ferroelectric layer.

15. The method according to claim 14, wherein a ferroelectric mix crystal formed substantially of barium titanate is precipitated upon a substrate of monocrystalline silicon, and the gaseous phase is given an admixture of lead titanate or lead titanium stannate in the amount required to have the lattice constant of the ferroelectric form a ratio to that of silicon substantially equal to 4:3.

16. The method according to claim 13 which comprises vapor-depositing barium titanate upon a monocrystalline substrate of silicon at a temperature of 1050 to 1100° C.

17. The method according to claim 13 which comprises precipitating a semiconducting mix crystal upon a substrate formed of the layer of ferroelectric material, and adding the components of the semiconducting mix crystal to the gaseous atmosphere in the ratio required for epitaxial growth of the semiconductor portion.

18. The method according to claim 17, wherein a mix crystal of $A^{III}B^{V}$ compounds is precipitated upon a substrate of barium titanate, the shares of the mix-crystal components being in a proportion that the lattice constant of the barium titanate to that of the mix-crystal semiconductor is approximately equal to 2:3.

19. The method according to claim 18, wherein the components of said mix crystal are formed of gallium arsenide and gallium antimonide.

20. The method according to claim 13, wherein silicon is epitaxially precipitated in high vacuum upon a substrate of a ferroelectric material.

21. The method according to claim 20, wherein the ferroelectric material is a mix crystal containing barium titanate and either lead titanate or lead titanium stannate.

22. The method according to claim 20, wherein the ferroelectric mix crystal is formed of barium titanate with lead titanate and lead titanium stannate.

23. The method according to claim 17 which comprises growing the layer of ferroelectric material upon a metal support prior to depositing the semiconductor material.

References Cited

UNITED STATES PATENTS

| | | | |
|---|---|---|---|
| 2,791,758 | 5/1957 | Looney | 317—235 X |
| 2,791,760 | 5/1957 | Ross | 317—235 X |
| 2,791,761 | 5/1957 | Morton | 317—235 X |
| 3,365,631 | 1/1968 | Delaney et al. | 317—234 X |

JAMES T. KALLAM, *Primary Examiner.*

U.S. Cl. X.R.

317—238; 29—571